(12) United States Patent
Sakuta et al.

(10) Patent No.: US 8,890,403 B2
(45) Date of Patent: Nov. 18, 2014

(54) WHITE LIGHT-EMITTING DEVICE AND ILLUMINATION DEVICE

(71) Applicant: Mitsubishi Chemical Corporation, Chiyoda-ku (JP)

(72) Inventors: Hiroaki Sakuta, Odawara (JP); Yoshihito Satou, Ushiku (JP); Naoto Kijima, Machida (JP); Byungchul Hong, Yokohama (JP)

(73) Assignee: Mitsubishi Chemical Corporation, Chiyoda-ku (JP)

( * ) Notice: Subject to any disclaimer, the term of this patent is extended or adjusted under 35 U.S.C. 154(b) by 95 days.

(21) Appl. No.: 13/832,713

(22) Filed: Mar. 15, 2013

(65) Prior Publication Data

US 2013/0264937 A1 Oct. 10, 2013

Related U.S. Application Data

(63) Continuation of application No. PCT/JP2011/073698, filed on Oct. 14, 2011.

(30) Foreign Application Priority Data

Oct. 15, 2010 (JP) .................... 2010-232888

(51) Int. Cl.
*H01J 1/62* (2006.01)
*H01J 63/04* (2006.01)

(52) U.S. Cl.
USPC ........... 313/501; 313/483; 313/500; 313/502; 313/503; 313/504; 313/505; 313/506

(58) Field of Classification Search
None
See application file for complete search history.

(56) References Cited

U.S. PATENT DOCUMENTS

| 3,576,756 | A | 4/1971 | Russo |
| 8,581,488 | B2 * | 11/2013 | Sakuta et al. ............ 313/501 |
| 8,779,455 | B2 * | 7/2014 | Sakuta et al. ............ 257/98 |
| 2004/0135504 | A1 | 7/2004 | Tamaki et al. |
| 2006/0038477 | A1 | 2/2006 | Tamaki et al. |
| 2006/0169986 | A1 | 8/2006 | Radkov et al. |
| 2006/0169998 | A1 | 8/2006 | Radkov et al. |

(Continued)

FOREIGN PATENT DOCUMENTS

| JP | 2004-335579 A | 11/2004 |
| JP | 2009-65137 A | 3/2009 |
| JP | 2009-218422 A | 9/2009 |
| JP | 2010-93132 A | 4/2010 |

OTHER PUBLICATIONS

U.S. Appl. No. 14/041,171, filed Sep. 30, 203, Sakuta, et al.

(Continued)

*Primary Examiner* — Natalie Walford
(74) *Attorney, Agent, or Firm* — Oblon, Spivak, McClelland, Maier & Neustadt, L.L.P.

(57) ABSTRACT

The present invention provides a technology that allows reducing the used amount of a $Mn^{4+}$-activated fluoride complex phosphor without loss of luminous efficiency, in a white light-emitting device that is provided with the $Mn^{4+}$-activated fluoride complex phosphor and an LED element that is an excitation source of the phosphor.
The present invention provides a white light-emitting device comprises a blue LED element, as well as a yellow phosphor and/or a green phosphor and a red phosphor as phosphors that are excited by the blue LED element. The red phosphor contains a $Mn^{4+}$-activated fluoride complex phosphor and a $Eu^{2+}$-activated alkaline earth silicon nitride phosphor.

28 Claims, 7 Drawing Sheets

(56) References Cited

U.S. PATENT DOCUMENTS

| | | |
|---|---|---|
| 2006/0238671 A1 | 10/2006 | Kim et al. |
| 2007/0114562 A1 | 5/2007 | Radkov et al. |
| 2007/0205712 A1 | 9/2007 | Radkov et al. |
| 2008/0089825 A1 | 4/2008 | Tamaki et al. |
| 2009/0072708 A1 | 3/2009 | Tamaki et al. |
| 2009/0230840 A1 | 9/2009 | Tamaki et al. |
| 2009/0284132 A1 | 11/2009 | Tamaki et al. |
| 2009/0309485 A1 | 12/2009 | Tamaki et al. |
| 2010/0091215 A1 | 4/2010 | Fukunaga et al. |
| 2010/0142189 A1 | 6/2010 | Hong et al. |
| 2012/0112626 A1 | 5/2012 | Sakuta et al. |
| 2012/0212123 A1 | 8/2012 | Sakuta et al. |
| 2012/0267999 A1 | 10/2012 | Sakuta et al. |
| 2012/0286646 A1 | 11/2012 | Sakuta et al. |
| 2012/0319565 A1 | 12/2012 | Sakuta et al. |
| 2013/0082289 A1 | 4/2013 | Sakuta et al. |

OTHER PUBLICATIONS

International Search Report issued Dec. 27, 2011, in PCT/JP2011/073698.

U.S. Appl. No. 13/918,514, filed Jun. 14, 2013, Sakuta, et al.

* cited by examiner

WHITE LIGHT-EMITTING DEVICE AND ILLUMINATION DEVICE

CROSS-REFERENCE TO RELATED APPLICATION

This is a continuation of International Application PCT/JP2011/073698, filed on Oct. 14, 2011, and designated the U.S., (and claims priority from Japanese Patent Application 2010-232888 which was filed on Oct. 15, 2010) the entire contents of which are incorporated herein by reference.

TECHNICAL FIELD

The present invention relates to a white light-emitting device that is provided with a $Mn^{4+}$-activated fluoride complex phosphor that emits red light, and with an LED (light-emitting diode) element that is an excitation source of the phosphor.

BACKGROUND ART

Known red phosphors having a narrow-band emission spectrum include $Mn^{4+}$-activated fluoride complex phosphors (Patent Document 1). Light emitted by such phosphors comprises substantially no component of wavelength longer than the main emission peak wavelength (ordinarily, 620 to 640 nm), i.e. substantially no deep-red component of low luminosity factor. Also, such phosphors absorb substantially no light having a wavelength of 490 nm or longer, i.e. substantially no light emitted by a green phosphor or a yellow phosphor. Such properties are deemed to be ideal properties of a red phosphor for white LEDs for illumination where higher efficiency is desirable. A high-efficiency white LEDs that emits warm white light and in which $K_2TiF_6$:Mn, which is a $Mn^{4+}$-activated fluoride complex phosphor, is concomitantly used with a broad-band yellow phosphor $Tb_3Al_5O_{12}$:Ce, has actually been reported (Patent Document 2).

PRIOR ART DOCUMENTS

Patent Document 1: U.S. Pat. No. 3,576,756
Patent Document 2: US Patent Application Publication No. 2006/0169998

SUMMARY OF THE INVENTION

Problems to be Solved by the Invention

The inventors had produced trial white LEDs that emit warm white light, using KSNAF (described in detail further on), which is a $Mn^{4+}$-activated fluoride complex phosphor, and a yellow phosphor YAG:Ce, and had found that the white LED afforded superior luminous efficiency. In this trial production, a blue LED element was sealed using a paste resulting from adding powders of KSNAF and YAG:Ce to a liquid silicone resin. However, KSNAF had to be added to a high concentration in the silicone resin in order to achieve the target chromaticity, and the viscosity of the paste became very high as a result.

High paste viscosity results in poorer transportability (due to lower fluidity and less precise dosing), occurrence of cob-webbing, more difficult defoaming, as well as difficulties in achieving a homogeneous phosphor dispersion, all of which translates into a lower manufacturing efficiency of the white LED. It is deemed, therefore, that it would be possible to produce more efficiently a white LED that uses a $Mn^{4+}$-activated fluoride complex phosphor if the used amount of the phosphor could be reduced.

Also, costly fluorine-containing compounds are used to produce the $Mn^{4+}$-activated fluoride complex phosphor, and hence reducing the amount of the phosphor used would also be advantageous in terms of cost.

Therefore, the present invention provides a technology that allows reducing, without loss of luminous efficiency, the amount of $Mn^{4+}$-activated fluoride complex phosphor that is used, in a white light-emitting device that comprises the $Mn^{4+}$-activated fluoride complex phosphor and an LED element that is an excitation source of the phosphor.

Means of Solving the Problems

The gist of the present invention is as follows.

(1) A white light-emitting device comprising: an LED element that emits blue light; and a resin composition that contains a phosphor that emits yellow light and/or a phosphor that emits green light through wavelength conversion of light emitted by the LED element that emits blue light, and a phosphor that emits red light through wavelength conversion of light emitted by the LED element that emits blue light,
wherein the phosphor that emits red light contains at least a $Mn^{4+}$-activated fluoride complex phosphor and an $Eu^{2+}$-activated alkaline earth silicon nitride phosphor, and
a content ratio of the $Eu^{2+}$-activated alkaline earth silicon nitride phosphor with respect to the total of the $Mn^{4+}$-activated fluoride complex phosphor and $Eu^{2+}$-activated alkaline earth silicon nitride phosphor contained in the resin composition ranges from 0.5 wt % to 14.0 wt %.

(2) A white light-emitting device comprising: an LED element; and a resin composition that contains a phosphor that emits blue light through wavelength conversion of light emitted by the LED element, a phosphor that emits yellow light and/or a phosphor that emits green light through wavelength conversion of light emitted by the LED element, and a phosphor that emits red light through wavelength conversion of light emitted by the LED element,
wherein the phosphor that emits red light contains at least a $Mn^{4+}$-activated fluoride complex phosphor and an $Eu^{2+}$-activated alkaline earth silicon nitride phosphor, and
a content ratio of the $Eu^{2+}$-activated alkaline earth silicon nitride phosphor with respect to the total of the $Mn^{4+}$-activated fluoride complex phosphor and $Eu^{2+}$-activated alkaline earth silicon nitride phosphor contained in the resin composition ranges from 0.5 wt % to 14.0 wt %.

(3) The white light-emitting device according to (1) or (2), wherein $\lambda_{R1}-20 \leq \lambda_{R2} \leq \lambda_{R1}+30$ is satisfied where $\lambda_{R1}$ nm is an emission peak wavelength of the $Mn^{4+}$-activated fluoride complex phosphor and $\lambda_{R2}$ nm is an emission peak wavelength of the $Eu^{2+}$-activated alkaline earth silicon nitride phosphor.

(4) The white light-emitting device according to (3), wherein a maximum peak wavelength in an emission spectrum of the $Eu^{2+}$-activated alkaline earth silicon nitride phosphor ranges from 600 to 630 nm.

(5) The white light-emitting device according to (3) or (4), wherein the $Mn^{4+}$-activated fluoride complex phosphor is KSF or KSNAF.

(6) The white light-emitting device according to any one of (3) to (5), wherein the $Eu^{2+}$-activated alkaline earth silicon nitride phosphor is $Sr_yCa_{1-y}AlSiN_3$:Eu.

(7) The white light-emitting device according to any one of (1) to (6), wherein the phosphor that emits yellow light is a $(Y_{1-u},Gd_u)_3(Al_{1-v},Ga_v)_5O_{12}$:Ce,Eu phosphor (where u and v are $0 \leq u \leq 0.3$ and $0 \leq v \leq 0.5$, respectively) or $Ca_{1.5x}La_{3-x}Si_6N_{11}$:Ce (where x is $0 \leq x \leq 1$).

(8) The white light-emitting device according to any one of (1) to (7), wherein the $Mn^{4+}$-activated fluoride complex phosphor is dispersed in a cured product of a resin paste.

(9) The white light-emitting device according to (8), wherein a base resin of the resin paste is a silicone resin.

(10) The white light-emitting device according to any one of (1) to (9), wherein a correlated color temperature of emitted white light ranges from 1600 to 4000 K.

(11) The white light-emitting device according to any one of (1) to (9), wherein a correlated color temperature of emitted white light ranges from 2500 to 3500 K.

(12) The white light-emitting device according to any one of (1) to (11), wherein a blending proportion of the $Mn^{4+}$-activated fluoride complex phosphor contained in the resin composition ranges from 10 wt % to 50 wt %, and a blending proportion of the $Eu^{2+}$-activated alkaline earth silicon nitride phosphor contained in the resin composition ranges from 0.1 wt % to 5.0 wt %.

(13) A white light-emitting device, comprising: an LED element that emits blue light; a phosphor that emits yellow light and/or a phosphor that emits green light through wavelength conversion of light emitted by the LED element that emits blue light; and a phosphor that emits red light through wavelength conversion of light emitted by the LED element that emits blue light; or comprising: an LED element; a phosphor that emits blue light through wavelength conversion of light emitted by the LED element; a phosphor that emits yellow light and/or a phosphor that emits green light through wavelength conversion of light emitted by the LED element; and a phosphor that emits red light through wavelength conversion of light emitted by the LED element, wherein the phosphor that emits red light contains a $Mn^{4+}$-activated fluoride complex phosphor dispersed in a first translucent matrix and an $Eu^{2+}$-activated alkaline earth silicon nitride phosphor dispersed in a second translucent matrix, and a content ratio of the $Eu^{2+}$-activated alkaline earth silicon nitride phosphor with respect to the total of the $Mn^{4+}$-activated fluoride complex phosphor and $Eu^{2+}$-activated alkaline earth silicon nitride phosphor ranges from 0.5 wt % to 14.0 wt %.

(14) The white light-emitting device according to (13), wherein a refractive index of the first translucent matrix is lower than a refractive index of the second translucent matrix.

(15) The white light-emitting device according to (14), wherein all the phosphors, except the $Mn^{4+}$-activated fluoride complex phosphor, are dispersed in the second translucent matrix.

(16) The white light-emitting device according to any one of (13) to (15), wherein the first translucent matrix is a cured product of a resin paste.

(17) The white light-emitting device according to (16), wherein a base resin of the resin paste is a silicone resin.

(18) The white light-emitting device according to (17), wherein a refractive index of the silicone resin is smaller than 1.45.

(19) The white light-emitting device according to any one of (13) to (18), wherein a correlated color temperature of emitted white light ranges from 1600 to 4000 K.

(20) The white light-emitting device according to any one of (13) to (19), wherein a correlated color temperature of emitted white light ranges from 2500 to 3500 K.

(21) A white light-emitting device comprising: an LED element that emits blue light; and a resin composition that contains a phosphor that emits yellow light and/or a phosphor that emits green light through wavelength conversion of light emitted by the LED element that emits blue light, and a phosphor that emits red light through wavelength conversion of light emitted by the LED element that emits blue light, wherein the phosphor that emits red light contains at least a red phosphor having a narrow-band emission spectrum such that a maximum emission peak thereof ranges from 600 nm to 660 nm and the full width at half maximum of a red emission peak is 20 nm or less, and a red phosphor having a broad-band emission spectrum such that a maximum emission peak thereof ranges from 600 nm to 660 nm and the full width at half maximum of a red emission peak is 80 nm or more, and a content ratio of the red phosphor having the broad-band emission spectrum with respect to the total of the red phosphor having the narrow-band emission spectrum and the red phosphor having the broad-band emission spectrum that are contained in the resin composition ranges from 0.5 wt % to 14.0 wt %.

(22) A white light-emitting device comprising: an LED element; and a resin composition that contains a phosphor that emits blue light through wavelength conversion of light emitted by the LED element, a phosphor that emits yellow light and/or a phosphor that emits green light through wavelength conversion of light emitted by the LED element, and a phosphor that emits red light through wavelength conversion of light emitted by the LED element, wherein the phosphor that emits red light contains at least a red phosphor having a narrow-band emission spectrum such that a maximum emission peak thereof ranges from 600 nm to 660 nm and the full width at half maximum of a red emission peak is 20 nm or less, and a red phosphor having a broad-band emission spectrum such that a maximum emission peak thereof ranges from 600 nm to 660 nm and the full width at half maximum of a red emission peak is 80 nm or more, and a content ratio of the red phosphor having the broad-band emission spectrum with respect to the total of the red phosphor having the narrow-band emission spectrum and the red phosphor having the broad-band emission spectrum that are contained in the resin composition ranges from 0.5 wt % to 14.0 wt %.

(23) The white light-emitting device according to (21) or (22), wherein a blending proportion of the red phosphor having the narrow-band emission spectrum and contained in the resin composition ranges from 10 wt % to 50 wt %.

(24) The white light-emitting device according to any one of (21) to (23), wherein a blending proportion of the red phosphor having the broad-band emission spectrum and contained in the resin composition ranges from 0.1 wt % to 5.0 wt %.

(25) An illumination device, comprising the white light-emitting device according to any one of (1) to (24).

Effect of the Invention

The embodiments that are set forth as the gist of the present invention make it possible to reduce the used amount of red phosphor having a narrow-band emission spectrum, for instance a $Mn^{4+}$-activated fluoride complex phosphor, without loss of luminous efficiency, in a white light-emitting device of high color rendering and that is provided with a red phosphor having a narrow-band emission spectrum, for instance a $Mn^{4+}$-activated fluoride complex phosphor or the like, and with an LED element that is an excitation source of the phosphor. Accordingly, a white light-emitting device can be obtained that boasts high production efficiency, by causing the viscosity of the resin composition that contains the red phosphor having a narrow-band emission spectrum, such as a $Mn^{4+}$-activated fluoride complex phosphor or the like, to lie within an appropriate viscosity range.

EMBODIMENT FOR CARRYING OUT THE INVENTION

Figure 1:
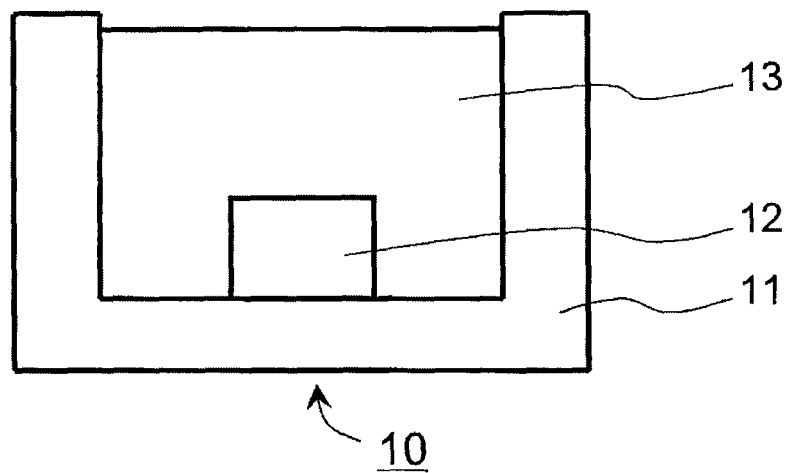
FIG. 1 illustrates schematically a cross-sectional structure of a white light-emitting device according to an embodiment of the present invention.

In the invention and in the present description, light having a color that exhibits a deviation Duv of −20 to +20 from the black-body radiation locus is referred to as white light. The definition of Duv (=1000 duv) conforms to JIS Z 8725:1999 "Method for Determining Distribution Temperature and Color Temperature or Correlated Color Temperature of Light Sources".

In one embodiment thereof, the present invention provides a white light-emitting device that comprises a phosphor, and an LED element that is an excitation source of the phosphor. The white light-emitting device comprises an LED element that emits blue light, a phosphor that emits yellow light (hereafter also referred to as yellow phosphor) and a phosphor that emits red light (hereafter also referred to as red phosphor) through wavelength conversion upon being excited, directly or indirectly, by light emitted by the LED element, such that white light can be emitted that is combined light of the light respectively emitted by the blue LED element, the phosphor that emits yellow light and the phosphor that emits red light. Alternatively, the white light-emitting device may comprise an LED element that emits light of a shorter wavelength than blue, for instance, a near-ultraviolet LED element or a purple LED element, and a phosphor that emits blue light (hereafter also referred to as blue phosphor), a phosphor that emits yellow light and a phosphor that emits red light, through wavelength conversion upon being excited, directly or indirectly, by the light emitted by the LED element, such that white light can be emitted that is combined light of the light respectively emitted by the phosphor that emits blue light, the phosphor that emits yellow light and the phosphor that emits red light. In these white light-emitting devices, a phosphor that emits green light (hereafter also referred to as green phosphor), through wavelength conversion when being excited directly or indirectly by light emitted by the LED element, may be used instead of, or in addition to, the yellow phosphor.

An LED element having a light-emitting structure formed by various types of semiconductor, for instance GaN-based semiconductors, ZnO-based semiconductors, SiC-based semiconductor or the like, can be used in the white light-emitting device according to the present invention. The LED element may be fixed to a package such as a bullet-type package, an SMD-type package or the like, or may be directly fixed to a circuit board, as in the case of a chip-on-board light-emitting device. The way in which the LED element and the phosphors are optically coupled is not limited, and a transparent medium (such as air) may be simply interposed between the LED element and the phosphors; alternatively, an optical element such as a lens, an optical fiber, a waveguide, a reflective mirror or the like may be interposed between the LED element and the phosphors.

Particulate phosphors are preferably used in the white light-emitting device of the present invention, but the white light-emitting device is not limited thereto, and, for instance, the phosphors may be, in part, a light-emitting ceramic that contains a phosphor phase in the ceramic structure. Particulate phosphors are ordinarily dispersed in a translucent matrix having a polymer as a dispersion medium, in order for the phosphors to be immobilized thereby, but the phosphors may alternatively be deposited, by electrodeposition or some other method, on the surface of an appropriate member. Structures in which phosphor particles are dispersed in a translucent matrix are typically formed by curing a resin paste in which a particulate phosphor has been dispersed. Various structures can be adopted herein, for instance a structure in which the LED element is embedded in a cured product of such a paste, a structure wherein such a cured product covers, in the form of a film, part of the surface of the LED element, or a structure wherein a film comprising such a cured product is disposed at a site spaced apart from the LED element.

Embodiment 1

FIG. 1 illustrates schematically a cross-section of a white light-emitting device according to Embodiment 1 of the present invention. A white light-emitting device 10 illustrated in the figure comprises a blue LED element 12 that is fixed to the bottom face of a recess that is provided in a package 11, and a wavelength conversion layer 13 that seals the blue LED element 12. A particulate yellow phosphor and red phosphor (not shown) are substantially homogeneously dispersed in the interior of the wavelength conversion layer 13.

Although not shown in the figure, a known wiring pattern is provided in the package 11. The blue LED element 12 has an emission peak wavelength at 440 to 470 nm. The material and structure of the blue LED element 12 are not particularly limited, but, preferably, the blue LED element 12 is for instance a gallium nitride-based LED element that uses InGaN in a light-emitting layer. Preferably, the emission peak wavelength of the blue LED element is set in such a manner that the difference vis-à-vis the peak wavelength of the excitation spectrum of the $Mn^{4+}$-activated fluoride complex phosphor that is dispersed in the wavelength conversion layer 13 is no greater than 5 nm. The blue LED element 12 may be provided in the form of a plurality of elements.

The blue LED element 12 emits light upon application of current to the blue LED element 12 via the wiring pattern that is provided in the package 11; the yellow phosphor and the red phosphor emit light upon absorption of light emitted by the blue LED element 12. As a result, white light, resulting from mixing of light of dissimilar colors respectively emitted by the blue LED, the yellow phosphor and the red phosphor, is emitted out of the white light-emitting device 10.

Figure 8:
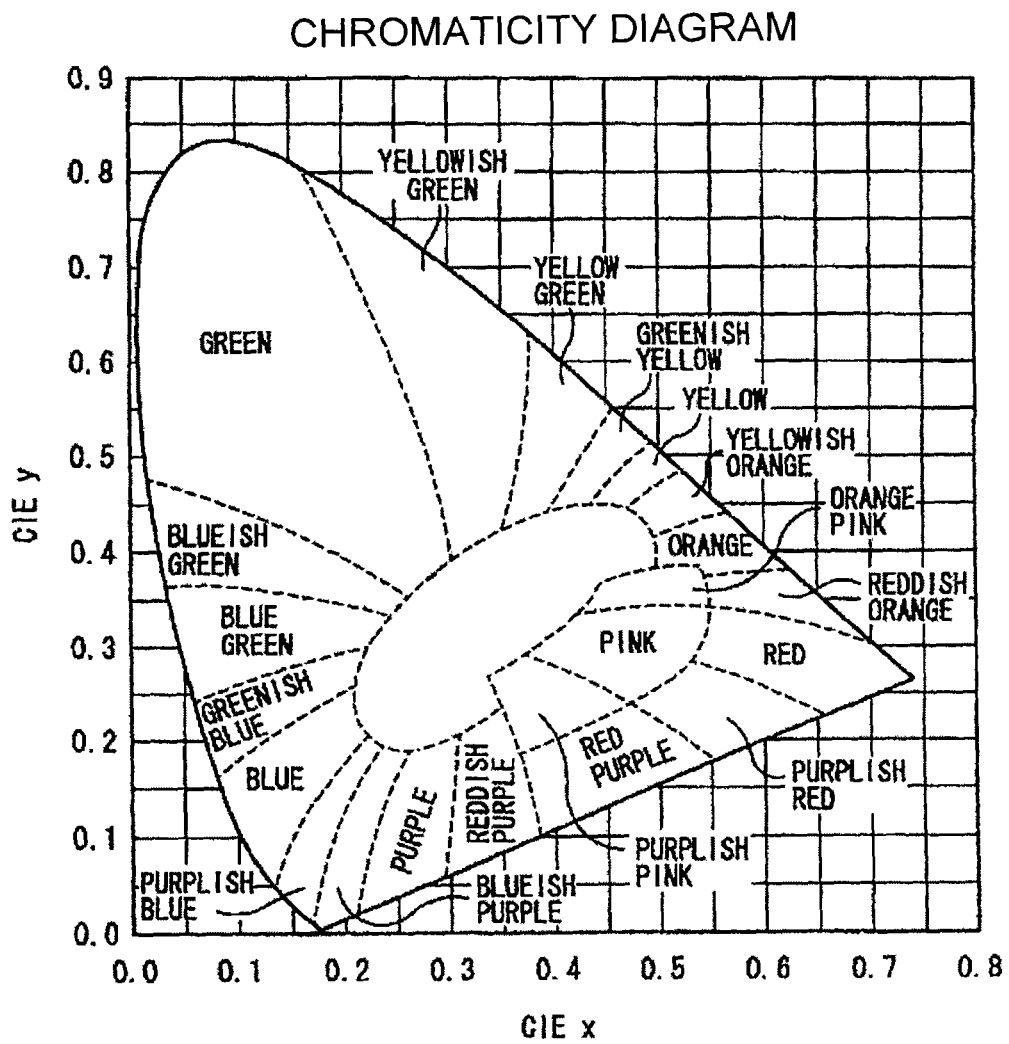
FIG. 8 is a chromaticity diagram (CIE 1931)

The yellow phosphor that is dispersed in the wavelength conversion layer 13 is a phosphor the emission color whereof is classified as "YELLOW GREEN", "GREENISH YELLOW", "YELLOW", or "YELLOWISH ORANGE" in the xy chromaticity diagram (CIE 1931) depicted in FIG. 8. The main emission peak wavelength of the yellow phosphor is ordinarily 530 nm or longer, preferably 540 nm or longer, and particularly preferably 550 nm or longer, and is ordinarily 620 nm or shorter, preferably 600 nm or shorter, and particularly preferably 580 nm or shorter.

Any organic or inorganic yellow phosphor that emits light upon absorption of blue light can be used, but inorganic phosphors are superior in terms of durability. Recommended such phosphors include, for instance, phosphors having $Ce^{3+}$ as an activator and a garnet-type oxide crystal as a base, represented by the general formula $(Y_{1-u},Gd_u)_3(Al_{1-v}Ga_v)_5O_{12}$:Ce,Eu (wherein u and v are $0 \leq u \leq 0.3$ and $0 \leq v \leq 0.5$, respectively), for instance $(Y,Gd)_3Al_5O_{12}$:Ce, $Tb_3Al_5O_{12}$:Ce or the like; or phosphors having $Ce^{3+}$ as an activator and having a lanthanum silicon nitride crystal as a base, for instance $La_3Si_6N_{11}$:Ce, $Ca_{1.5x}La_{3-x}Si_6N_{11}$:Ce (where x is $0 \leq x \leq 1$) or the like. These yellow phosphors are excited efficiently by blue light. Yellow phosphors having $Eu^{2+}$ as an activator, such as $(Ba, Sr, Ca)_2SiO_4$:Eu, α-Sialon:Eu or the like, can be excited efficiently not only by blue light, but also by near-ultraviolet light and purple light.

In the wavelength conversion layer 13 there can be dispersed a green phosphor instead of, or in addition to, the yellow phosphor. The term "green phosphor" denotes a phosphor that emits light having a color that is classified as "GREEN" or "YELLOWISH GREEN" in the xy chromaticity diagram (CIE 1931) depicted in FIG. 8. The main emission peak wavelength of the green phosphor is ordinarily 500 nm or longer, preferably 510 nm or longer, and particularly preferably 520 nm or longer, and is ordinarily 580 nm or shorter, preferably 570 nm or shorter, and particularly preferably 560 nm or shorter.

Any organic or inorganic green phosphor that emits light upon absorption of blue light can be used, but inorganic phosphors are superior in terms of durability. Green phosphors that use $Eu^{2+}$ or $Ce^{3+}$ as an activator are recommended herein. Green phosphors that use $Eu^{2+}$ as an activator include green phosphors that have, as a base, a crystal that comprises an alkaline earth silicate, an alkaline earth silicon oxynitride, or Sialon. Specific examples of green phosphors having an alkaline earth silicate crystal as a base include, for instance, $(Ba,Ca,Sr,Mg)_2SiO_4$:Eu, $(Ba,Sr,Ca)_2(Mg,Zn)Si_2O_7$:Eu or the like. Specific examples of green phosphors using an alkaline earth silicon oxynitride crystal as a base include, for instance, $(Ba,Ca,Sr)_3Si_6O_{12}N_2$:Eu, $(Ba,Ca,Sr)_3Si_6O_9N_4$:Eu, $(Ca,Sr,Ba)Si_2O_2N_2$:Eu or the like. Specific examples of green phosphors using a Sialon crystal as a base include, for instance, β-Sialon: Eu, $Sr_3Si_{13}Al_3O_2N_{21}$:Eu, $Sr_5Al_5Si_{21}O_2N_{35}$:Eu or the like. These green phosphors can be excited efficiently by blue light, and also by near-ultraviolet and purple light.

Examples of green phosphors that use $Ce^{3+}$ as an activator include, for instance, green phosphors having a garnet-type oxide crystal as a base, for instance $Ca_3(Sc,Mg)_2Si_3O_{12}$:Ce, or green phosphors having, as a base, a crystal of a scandate of an alkaline earth metal, for instance $CaSc_2O_4$:Ce. These green phosphors are efficiently excited by blue light.

The red phosphor that is dispersed in the wavelength conversion layer 13 is a phosphor the emission color whereof is classified as "RED", "REDDISH ORANGE" or "ORANGE" in the xy chromaticity diagram (CIE 1931) depicted in FIG. 8. As the red phosphor there is used a $Mn^{4+}$-activated fluoride complex phosphor and/or a $Eu^{2+}$-activated alkaline earth silicon nitride phosphor. The amount of $Mn^{4+}$-activated fluoride complex phosphor that is added to the wavelength conversion layer 13 can be significantly reduced by using concomitantly a small amount of a $Eu^{2+}$-activated alkaline earth silicon nitride phosphor, as the red phosphor, with substantially no drop in luminous efficiency as compared with an instance where a $Mn^{4+}$-activated fluoride complex phosphor alone is used. This effect is prominent when the white light emitted by the white light-emitting device 10 is warm white light having a significant amount of red component (color temperature ranging from 1600 to 4000 K, preferably from 2500 to 3500 K).

Herein, $Mn^{4+}$-activated fluoride complex phosphors are phosphors having $Mn^{4+}$ as an activator, and having a fluoride complex salt of an alkali metal, an amine or an alkaline earth metal, as a base crystal. The coordination center in the fluoride complex that forms the base crystal is a trivalent metal (B, Al, Ga, In, Y, Sc or lanthanoid), a tetravalent metal (Si, Ge, Sn, Ti, Zr, Re, Hf) or a pentavalent metal (V, P, Nb or Ta), with 5 to 7 fluorine atoms coordinated around the coordination center.

A preferred $Mn^{4+}$-activated fluoride complex phosphor is herein $A_2MF_6$:Mn having a hexafluoro complex salt of an alkali metal as a base crystal (A is one or more types selected from among Li, Na, K, Rb, Cs and $NH_4$, and M is one or more types selected from among Ge, Si, Sn, Ti and Zr). Particularly preferred among the foregoing is a $Mn^{4+}$-activated fluoride complex phosphor wherein A is one or more types selected from among K (potassium) and Na (sodium), and M is Si (silicon) or Ti (titanium), for instance $K_2SiF_6$:Mn (KSF), KSNAF ($K_2Si_{1-x}Na_xAl_xF_6$:Mn) in which some of the constituent elements of KSF (preferably, 10 mol % or less) are replaced by Al and Na, or $K_2TiF_6$:Mn (KTF).

In KSNAF, some of the constituent atoms of KSF (preferably, 10 mol % or less) are replaced by Al and Na. Herein, KSF and KSNAF can be produced in accordance with a method that involves using $K_2SiF_6$, $A_3AlF_6$, NaF, KF, $K_2MnF_6$, $KMnO_4$, $K_2MnCl_6$ or the like as starting material compounds, adding these starting material compounds to hydrofluoric acid in proper proportions, causing the compounds to dissolve and react, under stirring, and adding thereafter a poor solvent of the phosphor, to cause the phosphor to precipitate (antisolvent precipitation). This method may be carried out in the same way as in the method disclosed in Patent Document 1; also, a high-luminance phosphor having a larger particle size can be obtained by slowing down the addition rate of the poor solvent.

Examples of combinations of starting material compounds that can be used in the production of KSF or KSNAF by antisolvent precipitation are given below.

1) combination of $K_2SiF_6$, $K_2NaAlF_6$ and $K_2MnF_6$.
2) combination of $K_2SiF_6$, $K_3AlF_6$, NaF and $K_2MnF_6$.
3) combination of $K_2SiF_6$, $K_3AlF_6$, $Na_3AlF_6$ and $K_2MnF_6$.
4) combination of $K_2SiF_6$, KF, $Na_3AlF_6$ and $K_2MnF_6$.
5) combination of $K_2SiF_6$, $K_2NaAlF_6$ and $KMnO_4$.
6) combination of $K_2SiF_6$, $K_3AlF_6$, NaF and $KMnO_4$.
7) combination of $K_2SiF_6$, $K_3AlF_6$, $Na_3AlF_6$ and $KMnO_4$.
8) combination of $K_2SiF_6$, KF, $Na_3AlF_6$ and $KMnO_4$.
9) combination of $K_2SiF_6$ and $K_2MnCl_6$.
10) combination of $K_2SiF_6$, $K_3AlF_6$, NaF and $K_2MnCl_6$.
11) combination of $K_2SiF_6$, $K_3AlF_6$, $Na_3AlF_6$ and $K_2MnCl_6$.

Specific examples of $Eu^{2+}$-activated alkaline earth silicon nitride phosphors include, for instance, $(Ca,Sr,Ba)AlSiN_3$:Eu, $(Ca,Sr,Ba)_2Si_5N_8$:Eu, $SrAlSi_4N_7$:Eu, $(CaAlSiN_3)_{1-x}(Si_{(3n+2)/4}N_nO)_x$:EU and the like. Herein, $(CaAlSiN_3)_{1-x}(Si_{(3n+2)/4}N_nO)_x$:Eu has a base in the form of a solid solution crystal of $CaAlSiN_3$ and $Si_{(3n+2)/4}N_nO$, and hence is regarded as an alkaline earth silicon nitride phosphor.

Preferably, the maximum peak wavelength of the emission spectrum of the $Eu^{2+}$-activated alkaline earth silicon nitride phosphor ranges from 600 to 630 nm. Such $Eu^{2+}$-activated alkaline earth silicon nitride phosphors are preferred in that they exhibit high color rendering properties and high luminosity factor as red phosphors, and hence can be used for forming a light-emitting device of high luminous efficiency.

Preferably, the peak wavelengths of the $Mn^{4+}$-activated fluoride complex phosphor and the $Eu^{2+}$-activated alkaline earth silicon nitride phosphor that are contained, as red phosphors, in the wavelength conversion layer 13, obey a specific relationship. Specifically it is preferable that $\lambda_{R1}-20 \leq \lambda_{R2} \leq \lambda_{R1}+30$ is satisfied where $\lambda_{R1}$ nm denotes the emission peak wavelength of the $Mn^{4+}$-activated fluoride complex phosphor and $\lambda_{R2}$ nm denotes the emission peak wavelength of the $Eu^{2+}$-activated alkaline earth silicon nitride phosphor. It is more preferable that $\lambda_{R1}-20 \leq \lambda_{R2} \leq \lambda_{R1}$ is satisfied. A red phosphor that satisfies such a requirement exhibits high color rendering properties and high luminosity factor as a red phosphor, and hence a white light-emitting device can be achieved that has high luminous efficiency.

A transparent resin can be used as the base material of the wavelength conversion layer 13. Examples of resins include, for instance, various types of thermoplastic resins, thermosetting resins and photocurable resins, specific instances whereof include, for instance, methacrylic resins (polymethyl methacrylate or the like), styrene resins (polystyrene, styrene-acrylonitrile copolymers or the like), polycarbonate resins, polyester resins, phenoxy resins, butyral resins, polyvinyl alcohol, cellulose resins (ethyl cellulose, cellulose acetate, cellulose acetate butyrate and the like), epoxy resins, phenolic resins and silicone resins.

The base material of the wavelength conversion layer 13, made up of a resin composition, contains at least the $Mn^{4+}$-activated fluoride complex phosphor and the $Eu^{2+}$-activated alkaline earth silicon nitride phosphor.

The amount of $Mn^{4+}$-activated fluoride complex phosphor that is added to the wavelength conversion layer 13 can be significantly reduced by using concomitantly a small amount of a $Eu^{2+}$-activated alkaline earth silicon nitride phosphor, as a red phosphor, in the resin composition, with substantially no drop in luminous efficiency as compared with an instance where a $Mn^{4+}$-activated fluoride complex phosphor alone is used. Specifically, effects are elicited when the content ratio of the $Eu^{2+}$-activated alkaline earth silicon nitride phosphor with respect to the total of the $Mn^{4+}$-activated fluoride complex phosphor and $Eu^{2+}$-activated alkaline earth silicon nitride phosphor contained in the resin composition ranges from 0.5 wt % to 14.0 wt %. Preferably, the content ratio of the $Eu^{2+}$-activated alkaline earth silicon nitride phosphor is 0.5 wt % or higher, more preferably 1.5 wt % or higher, and yet more preferably 2.0 wt % or higher, and is preferably 14.0 wt % or lower, more preferably 10.0 wt % or lower, yet more preferably 6.0 wt % or lower.

The blending proportion of the $Mn^{4+}$-activated fluoride complex phosphor contained in the resin composition ranges preferably from 10 wt % to 50 wt %, more preferably from 15 wt % to 40 wt %, and yet more preferably from 16 wt % to 30 wt %.

The blending proportion of the $Eu^{2+}$-activated alkaline earth silicon nitride phosphor contained in the resin composition is preferably 0.1 wt % or higher, more preferably 0.2 wt % or higher, and yet more preferably 0.3 wt % or higher, and is preferably 5.0 wt % or lower, more preferably 3.0 wt % or lower, and yet more preferably 2.0 wt % or lower.

In the present invention it is possible to reduce the blending proportion of the $Mn^{4+}$-activated fluoride complex phosphor, as described above, and hence the viscosity of the resin composition is an appropriate one. If the viscosity is excessively high, a long time (10 seconds or longer) has to elapse until complete dripping of a target amount of resin composition upon scooping of the resin composition with a spatula and transfer of the resin composition to the package. Also, dispensing may fail to take place at an ordinary pressure using a dispenser, and/or the resin composition may fly off a nozzle if the pressure is increased, all of which detracts from the manufacturing efficiency of the white light-emitting device. If the viscosity is too low, on the other hand, handling becomes difficult during production of the light-emitting device.

In another configuration, the base material of the wavelength conversion layer 13 is made up of a resin composition that comprises at least a red phosphor having a narrow-band emission spectrum such that the maximum emission peak ranges from 600 nm to 660 nm and the full width at half maximum of the red emission peak is 20 nm or less, and a red phosphor having a broad-band emission spectrum such that the maximum emission peak ranges from 600 nm to 660 nm, and the full width at half maximum of the red emission peak is 80 nm or more.

The amount of red phosphor that has a narrow-band emission spectrum and that is added to the wavelength conversion layer 13 can be significantly reduced by using concomitantly, in the resin composition, also a small amount of the red phosphor having a broad-band emission spectrum, as a red phosphor, in addition to the red phosphor having a narrow-band emission spectrum, with substantially no drop in luminous efficiency as compared with an instance where there is used only the red phosphor having a narrow-band emission spectrum. Specifically, effects are elicited when the content ratio of the red-colored phosphor having a broad-band emission spectrum ranges from 0.5 wt % to 14.0 wt % with respect to the total of the red phosphor having a narrow-band emission spectrum and the red-colored phosphor having a broad-band emission spectrum that are contained in the resin composition. The content ratio of the red-colored phosphor having a broad-band emission spectrum is preferably 0.5 wt % or higher, more preferably 1.5 wt % or higher, and yet more preferably 2.0 wt % or higher, and is preferably 14.0 wt % or lower, more preferably 10.0 wt % or lower, yet more preferably 6.0 wt % or lower.

The blending proportion of the red phosphor having a narrow-band emission spectrum and contained in the resin composition ranges preferably from 10 wt % to 50 wt %, more preferably from 15 wt % to 40 wt %, and yet more preferably from 16 wt % to 30 wt %.

The blending proportion of the red-colored phosphor having a broad-band emission spectrum and contained in the resin composition is preferably 0.1 wt % or higher, more preferably 0.2 wt % or higher and yet more preferably 0.3 wt % or higher, and is preferably 5.0 wt % or lower, more preferably 3.0 wt % or lower, and yet more preferably 2.0 wt % or lower.

In the present invention, it is possible to reduce the blending proportion of the red phosphor having a narrow-band emission spectrum, as described above, and hence the viscosity of the resin composition is an appropriate one. If the viscosity is excessively high, a long time (10 seconds or longer) has to elapse until complete dripping of a target amount of resin composition upon scooping of the resin composition with a spatula and transfer of the resin composition to the package. Also, dispensing may fail to take place at an ordinary pressure using a dispenser, and/or the resin composition may fly off a nozzle if the pressure is increased, all of which detracts from the manufacturing efficiency of the white light-emitting device. If the viscosity is too low, on the other hand, handling becomes difficult during production of the light-emitting device.

Preferably, the maximum peak wavelength in the emission spectrum of the red phosphor having a broad-band emission spectrum ranges from 600 to 630 nm. Such a broad-band red-colored phosphor is preferred in that the phosphor exhibits high color rendering properties and high luminosity factor, as a red phosphor, and hence can be used for forming a light-emitting device of high luminous efficiency.

Preferably, the peak wavelength of the red phosphor having a narrow-band emission spectrum and the red-colored phosphor having a broad-band emission spectrum that are contained in the wavelength conversion layer 13 obey a specific relationship. Specifically, it is preferable that $\lambda_{R3}-40 \leq \lambda_{R4} \leq \lambda_{R3}+10$ is satisfied where $\lambda_{R3}$ nm denotes the emission peak wavelength of the red phosphor having a narrow-band emission spectrum and $\lambda_{R4}$ nm denotes the emission peak wavelength of the red-colored phosphor having a broad-band emission spectrum. High color rendering properties and high luminosity factor as a red phosphor are achieved through incorporation of a red phosphor that satisfies such a requirement. Accordingly, a white light-emitting device can be achieved that has high luminous efficiency.

Examples of narrow-band red phosphors having a maximum emission peak ranging from 600 nm to 660 nm and a full width at half maximum, of a red emission peak, of 20 nm or less include, for instance, $Mn^{4+}$-activated fluoride complex phosphors, red emission phosphors for ultraviolet to blue light excitation, characterized by containing Li, represented by the general formula $(La_{1-x-y}, Eu_x, Ln_y)_2O_2S$ (wherein x and y denote numbers that satisfy $0.02 \leq x \leq 0.50$ and $0 \leq y \leq 0.50$, respectively, and Ln represents at least one type of trivalent rare-earth element from among Y, Gd, Lu, Sc, Sm and Er), and a manganese-activated deep-red (600 nm to 670 nm) phosphor represented by chemical formula (1) below

$$(k-x)MgO.xAF_2.GeO_2:yMn^{4+} \tag{1}$$

(wherein k is a real number from 2.8 to 5, x is a real number from 0.1 to 0.7, y is a real number from 0.005 to 0.015, and A is calcium (Ca), strontium (Sr), barium (Ba), zinc (Zn) or a mixture thereof).

Examples of the red-colored phosphor having a broad-band emission spectrum such that the maximum emission peak ranges from 600 nm to 660 nm and the full width at half maximum of the red emission peak is 80 nm or more include, for instance, $Eu^{2+}$-activated alkaline earth silicon nitride phosphors, $Ba_3MgSi_2O_8:Eu^{2+},Mn^{2+}$ and the like.

In applications where, in particular, large output is required, such as illumination or the like, a silicon-containing compound, for the purpose of heat resistance, light resistance and so forth, is preferably used in the base material of the wavelength conversion layer 13. Herein, the term silicon-containing compound denotes a compound having a silicon atom in the molecule. Examples thereof include, for instance, organic materials (silicone-based materials) such as polyorganosiloxanes, and inorganic materials such as silicon oxide, silicon nitride, silicon oxynitride and the like. Particularly preferred among the foregoing are silicone-based materials, from the viewpoint of transparency, adhesiveness, ease of handling, and excellent mechanical-thermal stress relaxation characteristics, among other properties. Silicone-based materials ordinarily refer to organic polymers having siloxane bonds in the main chain. Depending on the curing mechanism, such materials may be, for instance, of condensation type, addition type, sol-gel type or photocurable type.

The base of the $Mn^{4+}$-activated fluoride complex phosphor is a fluorine-containing compound, and hence the phosphor exhibits ordinarily a low refractive index. In particular, the refractive index of phosphors having a hexafluorosilicate base is low. In an approximation using the refractive index of the base crystal, the refractive index of KSF is 1.34, and the refractive index of $(NH_4)_2SiF_6:Mn$ is 1.37. Preferably, therefore, the base material of the wavelength conversion layer 13 has a low refractive index, of 1.45 or less, so that the excitation light that strikes the particles of the $Mn^{4+}$-activated fluoride complex phosphor from outside is not significantly reflected at the surface. Examples of recommended base materials include, for instance, dimethyl silicone-based silicone resins. A light-diffusing material may be added to the wavelength conversion layer 13.

(Variation 1)

In Variation 1, the blue LED element 12 of Embodiment 1 is replaced by a near-ultraviolet or purple LED element, and a blue phosphor is added to the wavelength conversion layer 13. The blue phosphor is a phosphor that is classified as "PURPLISH BLUE", "BLUE" or "GREENISH BLUE" in the xy chromaticity diagram (CIE 1931) depicted in FIG. 8. The main emission peak wavelength of the blue phosphor is ordinarily 430 nm or longer, preferably 440 nm or longer, and is ordinarily 500 nm or shorter, preferably 480 nm or shorter, and particularly preferably 460 nm or shorter.

Any organic or inorganic blue phosphor that emits light upon absorption of near-ultraviolet light or purple light can be used herein, but inorganic phosphors are superior in terms of durability. Recommended such phosphors include, for instance, blue phosphors having $Eu^{2+}$ as an activator and having, as a base, a crystal that comprises an alkaline earth aluminate or alkaline earth halophosphate, for instance (Ba,Sr,Ca)$MgAl_{10}O_{17}$:Eu, $(Ca,Sr,Ba)_5(PO_4)_3Cl$:Eu or the like.

In Variation 1, the blue phosphor emits light upon absorption of light emitted by a near-ultraviolet or purple LED element. If the wavelength conversion layer 13 comprises a yellow phosphor or green phosphor having $Ce^{3+}$ as an activator, these phosphors emit light mainly upon absorption of the light emitted by the blue phosphor. The same is true of the $Mn^{4+}$-activated fluoride complex phosphor. Meanwhile, a phosphor contained in the wavelength conversion layer 13 and having $Eu^{2+}$ as an activator (including the $Eu^{2+}$-activated alkaline earth silicon nitride phosphor) emits light upon absorption of both light emitted by the near-ultraviolet or purple LED element, and light emitted by the blue phosphor. Thus, part of the phosphor is excited indirectly by the LED element. Therefore, the luminous efficiency of the white light-emitting device according to Variation 1 tends to be poorer than that of the white light-emitting device of Embodiment 1. The blue phosphor, by contrast, has a broader emission band than that of the blue LED element, and hence the white light-emitting device according to Variation 1 tends to be superior to the white light-emitting device of Embodiment 1 as regards color rendering properties.

Embodiment 2

Figure 2:
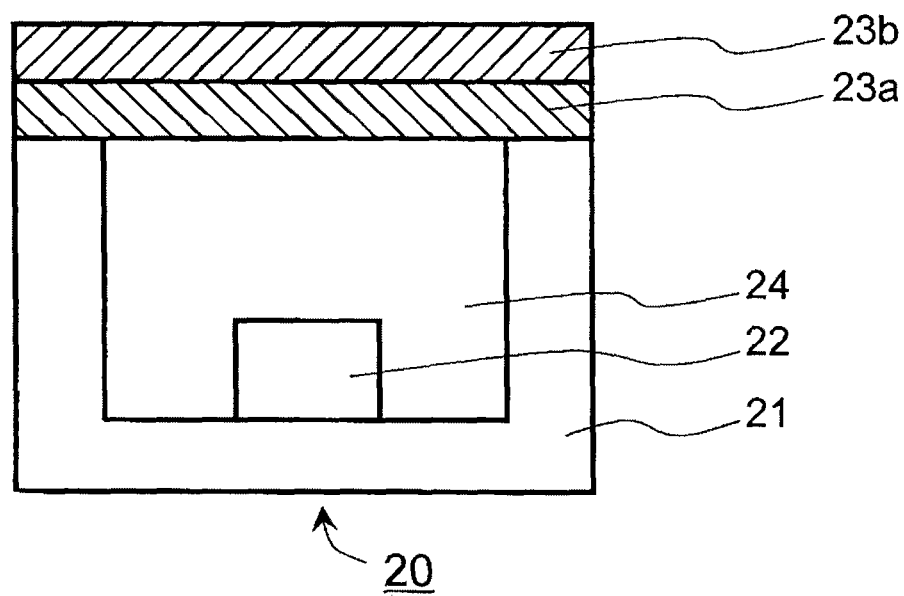
FIG. 2 illustrates schematically a cross-sectional structure of a white light-emitting device according to an embodiment of the present invention.

FIG. 2 illustrates schematically a cross-section of a white light-emitting device according to Embodiment 2 of the present invention. A white light-emitting device 20 illustrated in the figure comprises a blue LED element 22 that is fixed to the bottom face of a recess that is provided in a package 21, a first wavelength conversion layer 23a that is disposed above the blue LED element 22 with an intervening space 24 in between, and a second wavelength conversion layer 23b that is stacked on the first wavelength conversion layer 23a. The first wavelength conversion layer 23a and the second wavelength conversion layer 23b are configured through dispersion of a particulate phosphor in a translucent matrix. The phosphor dispersed in the first wavelength conversion layer 23a comprises a $Mn^{4+}$-activated fluoride complex phosphor that emits red light. The phosphor dispersed in the second wavelength conversion layer 23b comprises a $Eu^{2+}$-activated alkaline earth silicon nitride phosphor that emits red light. A yellow phosphor may be incorporated in either wavelength conversion layer, but in terms of refractive index, the yellow phosphor preferably incorporated in the wavelength conversion layer that does not contain the $Mn^{4+}$-activated fluoride complex phosphor. In the second wavelength conversion layer 23b, a green phosphor may be dispersed instead of, or in addition to, the yellow phosphor.

The space 24 may be void, or part thereof may be filled with a translucent filler. Preferably, the entirety of the space 24 is filled with a translucent filler. The same materials as exemplified for the base material of the wavelength conversion layer 13 in Embodiment 1 may be used in the filler.

The same phosphors as in Embodiment 1 are used in the phosphors contained in the blue LED element 22, the first wavelength conversion layer 23a and the second wavelength conversion layer 23b. The materials exemplified as the base material of the wavelength conversion layer 13 in Embodiment 1 can be used in the translucent matrix of the first wavelength conversion layer 23a and the second wavelength conversion layer 23b.

The white light-emitting device 20 can be produced in accordance with the following procedure.

1) There is produced a sheet molded body A that comprises a composition in which a $Mn^{4+}$-activated fluoride complex phosphor is dispersed in a translucent matrix.

2) There is produced a sheet molded body B that comprises a composition in which a yellow phosphor and a $Eu^{2+}$-activated alkaline earth silicon nitride phosphor is dispersed in a translucent matrix.

3) The sheet molded body A and the sheet molded body B are stacked and bonded to each other, to produce a stack sheet.

4) The blue LED element 22 is fixed to the interior of the recess of the package 21.

5) The stack sheet produced in 3) above is bonded to the top of the package 21, in such a way so as to plug the recess. The sheet molded body A yields the first wavelength conversion layer 23a and the sheet molded body B yields the second wavelength conversion layer 23b. The stack sheet may be bonded to the package 21 with either side of the stack sheet facing outward, or the first wavelength conversion layer 23a may be the outward side contrary to the example of FIG. 2.

In the above procedure, in a case where, for instance a thermosetting resin is used in the base of the translucent matrix of the first wavelength conversion layer 23a and of the second wavelength conversion layer 23b, the sheet molded body A and the sheet molded body B can be strongly bonded to each other through complete curing at the stage of forming the stack sheet, without complete curing of thermosetting resin at the stage of producing the two sheet molded bodies. If a thermoplastic resin is used as the base of the translucent matrix of the first wavelength conversion layer 23a and of the second wavelength conversion layer 23b, the two sheet molded bodies can be strongly bonded to each other through pressing at a temperature equal to or higher than the softening temperature of thermoplastic resin.

As described above, the $Mn^{4+}$-activated fluoride complex phosphor has a low refractive index. Therefore, a resin having a low refractive index is preferably used as the base of the translucent matrix of the first wavelength conversion layer 23a. A recommended resin herein is, for instance, a commercially-available dimethyl silicone resin having a refractive index 1.41.

On the other hand, the $Eu^{2+}$-activated alkaline earth silicon nitride phosphor is dispersed in the second wavelength conversion layer 23b. The $Eu^{2+}$-activated alkaline earth silicon nitride phosphor is an inorganic phosphor. The yellow phosphor and/or green phosphor that are likewise dispersed are also preferably inorganic phosphors. The refractive index of inorganic phosphors, even when low, is of 1.6 or higher, and is for instance of 1.90 for YAG:Ce. Preferably, therefore, the refractive index of the translucent matrix of the second wavelength conversion layer 23b is higher than that of the translucent matrix of the first wavelength conversion layer 23a, in order for light emitted by the phosphors not to be strongly trapped within phosphor particles.

Preferably, the refractive index of the translucent matrix of the second wavelength conversion layer 23b is higher than 1.50. Epoxy resins having a refractive index ranging from 1.53 to 1.57 are available. Diphenyldimethyl-based and phenylmethyl-based silicone resins having a refractive index of 1.52 (for instance, SCR-1011 by Shin-Etsu Chemical Co., Ltd.) are available. Polycarbonate resins, styrene resins and others have likewise refractive indices higher than 1.50. As is known, the refractive index of epoxy resins, silicone resins, acrylic resins, polycarbonate resins and the like can be increased up to about 1.8 through addition of high-refractive index inorganic nanoparticles that comprise, for instance, calcium oxide, cerium oxide, hafnium oxide, titanium oxide, zinc oxide, zirconium oxide or the like. If the refractive index of the translucent matrix exceeds the refractive index of the phosphor, however, efficiency may drop in some instances due to reflection of excitation light on the surface of the phosphor.

In terms of refractive index, preferably, all phosphors, except the $Mn^{4+}$-activated fluoride complex phosphor, are dispersed in the second translucent matrix of high refractive index.

(Variation 2)

Figure 3:
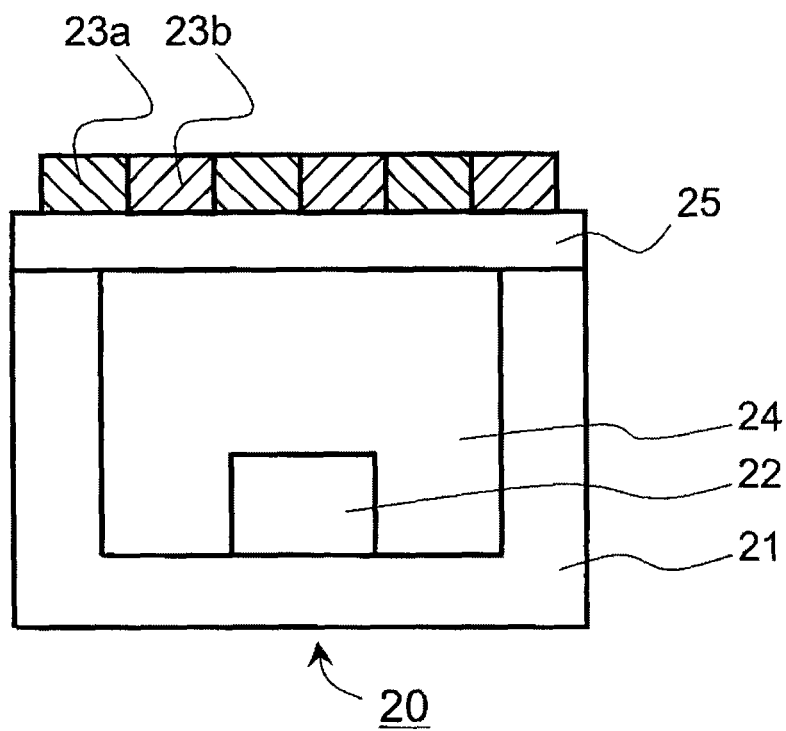
FIG. 3 illustrates schematically a cross-sectional structure of a white light-emitting device according to an embodiment of the present invention.

In Variation 2, the first wavelength conversion layer 23a and the second wavelength conversion layer 23b of Embodiment 2 are formed side by side on the surface of a transparent film 25 that comprises glass or a polymer as depicted in FIG. 3.

Embodiment 3

Figure 4:
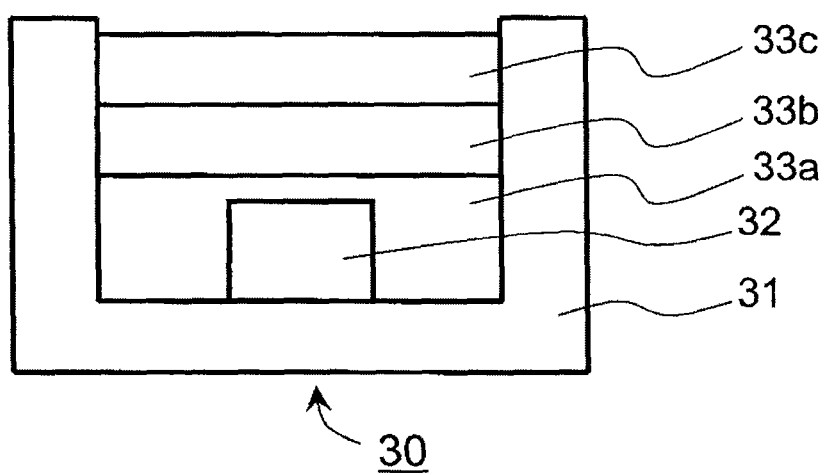
FIG. 4 illustrates schematically a cross-sectional structure of a white light-emitting device according to an embodiment of the present invention.

FIG. 4 illustrates schematically a cross-section of a white light-emitting device according to Embodiment 3 of the present invention. A white light-emitting device 30 illustrated in the figure comprises a blue LED element 32 that is fixed to the bottom face of a recess that is provided in a package 31, a first wavelength conversion layer 33a that is formed so as to seal the blue LED element 32, a second wavelength conversion layer 33b stacked on the first wavelength conversion layer 33a, and a further third wavelength conversion layer 33c stacked on the second wavelength conversion layer 33b. The first wavelength conversion layer 33a, the second wavelength conversion layer 33b and the third wavelength conversion layer 33c are configured through dispersion of a particulate phosphor in a translucent matrix. The phosphor dispersed in the first wavelength conversion layer 33a comprises a $Eu^{2+}$-activated alkaline earth silicon nitride phosphor that emits red light. The phosphor dispersed in the second wavelength conversion layer 33b is a yellow phosphor and/or a green phosphor. The phosphor dispersed in the third wavelength conversion layer 33c is a $Mn^{4+}$-activated fluoride complex phosphor that emits red light.

The same phosphors as in Embodiment 1 are used in the phosphors contained in the blue LED element 32, the first wavelength conversion layer 33a, the second wavelength conversion layer 33b and the third wavelength conversion layer 33c. The first wavelength conversion layer 33a, the second wavelength conversion layer 33b and the third wavelength conversion layer 33c are formed through pouring of a resin paste, having the phosphor dispersed therein, into the recess of the package 31, followed by curing. The base of the resin paste is for instance a silicone resin or an epoxy resin.

A low-refractive index resin, for instance a dimethyl silicone resin, is used as the base in the translucent matrix of the third wavelength conversion layer 33c in which the $Mn^{4+}$-activated fluoride complex phosphor is dispersed. Preferably, the refractive index of the translucent matrix of the first wavelength conversion layer 33a in which the $Eu^{2+}$-activated alkaline earth silicon nitride phosphor is dispersed is higher than that of the third wavelength conversion layer 33c. Preferably, an inorganic phosphor is dispersed in the second wavelength conversion layer 33b, and the refractive index of the translucent matrix is preferably higher than that of the third wavelength conversion layer 33c. Light generated in the blue LED element 31 and light generated in the first wavelength conversion layer 33a can be extracted easily towards the exterior across the surface of the third wavelength conversion layer 33c, so that luminous efficiency is thus improved, by setting $n_1 > n_2 > n_3$, wherein $n_1$, $n_2$, $n_3$ denote respectively the refractive indices of the translucent matrices of the first wavelength conversion layer 33a, the second wavelength conversion layer 33b and the third wavelength conversion layer 33c.

Experimental Examples

The present invention is explained below in more concrete terms based on examples, but the scope of the present invention is not limited to or by the specific examples.

One 350 μm-square InGaN-based blue LED element having an emission peak wavelength of 450 nm was packaged in a 3528SMD-type PPA resin package, and was sealed with a silicone resin composition having a phosphor dispersed therein, to produce a white LED that emitted white light having a correlated color temperature of about 2700 K. The silicone resin that is the base of the composition is of low-refractive index type, with a refractive index ranging from 1.41 to less than 1.45.

The KSNAF used in the present experimental example was synthesized according to the following procedure. Firstly, 3.4712 g of $K_2MnF_6$ and 1.3252 g of NaF were dissolved in a mixed solution of 40 ml of an $H_2SiF_6$ aqueous solution (33 wt %) and 160 ml of hydrofluoric acid (47.3 wt %), to prepare a solution (solution A). Next, the solution A was added to a solution (solution B) resulting from dissolving 18.92 g of $KHF_2$ and 8.16 g of $K_3AlF_6$ in 320 ml of hydrofluoric acid (47.3 wt %). The solution B was held at 26° C., and yellow crystals precipitated upon addition, under stirring, of the solution A. The yellow crystals were filtered off using No. 5C filter paper, were washed thrice thereafter with 50 ml of ethanol, and were dried at 150° C. for 2 hours, to yield 19.6 g of a phosphor (KSNAF).

Figure 5:
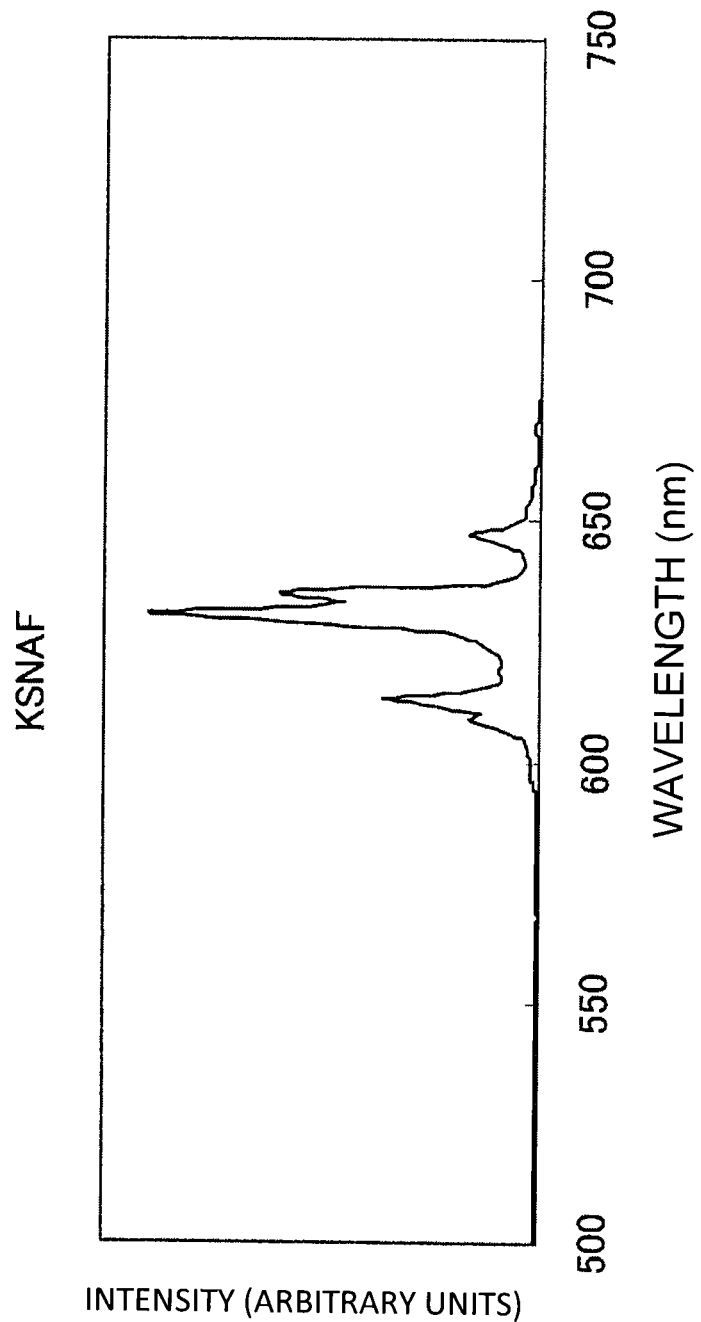
FIG. 5 illustrates an emission spectrum of a KSNAF phosphor.
Figure 6:
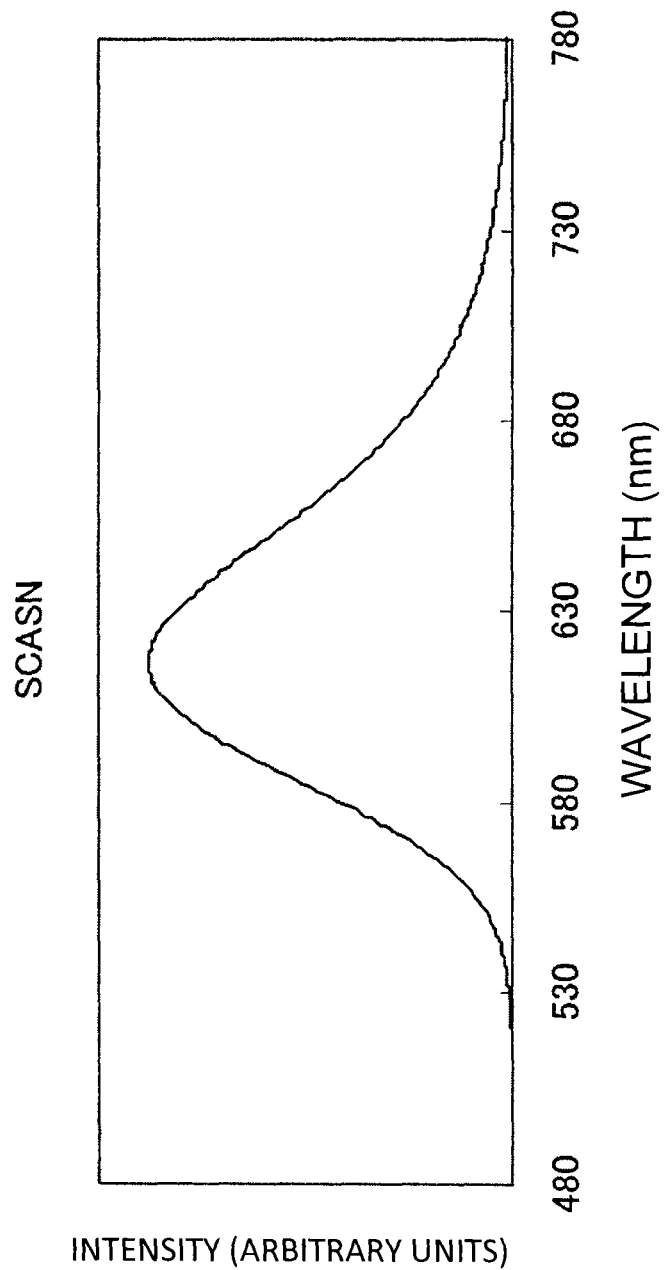
FIG. 6 illustrates an emission spectrum of a SCASN phosphor.

In the white LEDs according to the examples of the present invention, $Y_3Al_5O_{12}$:Ce (abbreviation YAG) and $La_3Si_6N_{11}$:Ce (abbreviation LSN) were used as yellow phosphors, and KSNAF, KSF and $Sr_xCa_{1-x}AlSiN_3$:Eu (abbreviation SCASN) were used as red phosphors. In the white LEDs according to the comparative examples, YAG or LSN was used as a yellow phosphor as in the examples, but only one from among KSNAF or KSF and SCASN was used as the red phosphor. Specifically, KSNAF or KSF alone was used in Comparative Examples 1 and 3, and SCASN alone was used in Comparative Examples 2 and 4. Table 1 gives the emission characteristics of the phosphors used in the examples and comparative examples. FIG. 5 and FIG. 6 illustrate the emission spectra of KSNAF and SCASN. The emission peak wavelength 617 nm of SCASN is 14 nm shorter than the maximum emission peak wavelength 631 nm of KSNAF, and is positioned at a longer wavelength than the peak wavelength 613 nm of the comparatively broad-emission band of KSNAF on the shorter wavelength side of the maximum emission peak.

TABLE 1

|  | Abbreviation | Emission color | Emission peak wavelength [nm] (excitation wavelength [nm]) | Full width at half maximum [nm] |
|---|---|---|---|---|
| Phosphor type | YAG | Yellow | 559 (465) | 113 |
|  | LSN | Yellow | 532 (470) | 115 |
|  | KSF | Red | 631 (455) | 5 |
|  | SCASN | Red | 617 (455) | 81 |

Table 2 gives the blending ratio of the various phosphors in the silicone resin compositions used to produce the white LEDs according to the examples and comparative examples.

TABLE 2

|  | Phosphor type | | Phosphor blending ratio [wt %] |
|---|---|---|---|
|  | Emission color | Abbreviation |  |
| Example 1 | Yellow | YAG | 7.5 |
|  | Red | KSNAF | 11.5 |
|  | Red | SCASN | 1.3 |
| Comparative Example 1 | Yellow | YAG | 6.0 |
|  | Red | KSNAF | 38.4 |
| Comparative Example 2 | Yellow | YAG | 7.7 |
|  | Red | SCASN | 2.4 |
| Example 2 | Yellow | LSN | 5.5 |
|  | Red | KSF | 24.7 |
|  | Red | SCASN | 0.5 |
| Comparative Example 3 | Yellow | LSN | 4.4 |
|  | Red | KSF | 31.7 |
| Comparative Example 4 | Yellow | LSN | 8.1 |
|  | Red | SCASN | 2.4 |

As Table 2 shows, the blending ratio of KSNAF in the silicone resin composition had to be increased to 38.4 wt %, and the blending ratio of KSF to 31.7 wt %, in Comparative Examples 1 and 3 where KSNAF or KSF alone was used as the red phosphor, in order to produce a white LED having a correlated color temperature of about 2700 K. In Example 1 and Example 2, by contrast, the blending ratio of KSNAF could be reduced to 11.5 wt %, and the blending ratio of KSF to 24.7 wt %, through the concomitant use of a small amount of SCASN. Along with that, the viscosity of the silicone resin paste used for sealing the white LEDs in Examples 1 and 2 dropped significantly with respect to the silicone resin paste used in Comparative Examples 1 and 3.

Figure 7:
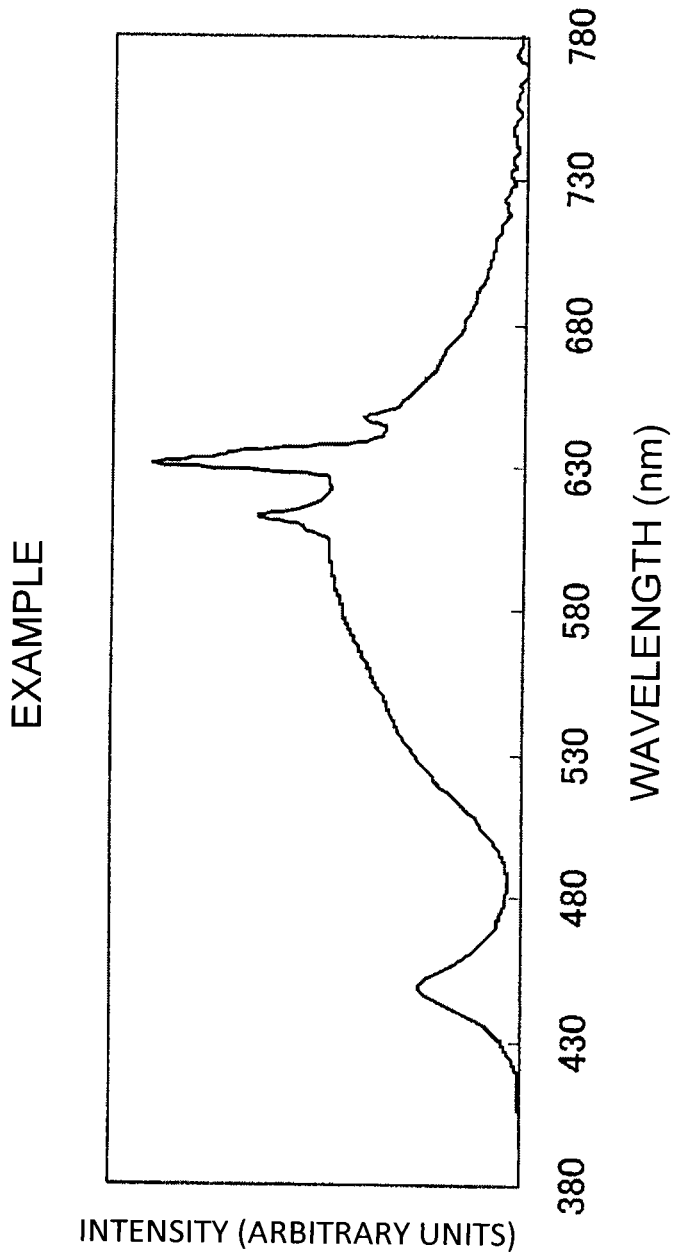
FIG. 7 illustrates an emission spectrum of a white LED according to Example 1 of the present invention.

Table 3 gives the emission characteristics, upon application of a 20 mA current, of the white LEDs of Examples 1 to 2, and Comparative Examples 1 to 4. FIG. 7 illustrates the emission spectrum of the white LED according to Example 1.

types of white LED were simulated by varying 'n' in the above ratio, in increments of 1, from 1 to 9.

Figure 9:
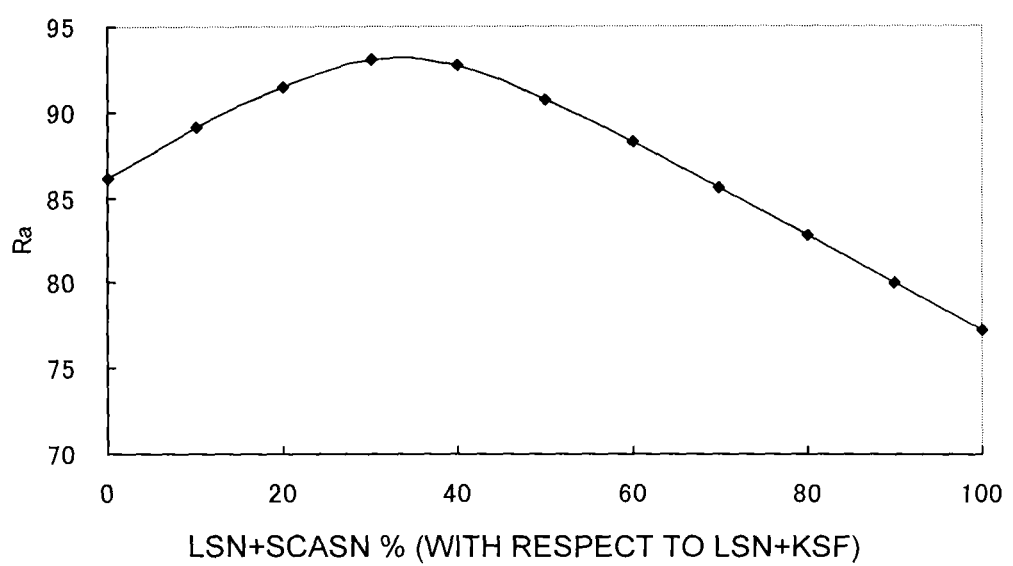
FIG. 9 illustrates changes in color rendering properties upon variation of a ratio of mixed light in a white light-emitting device according to a simulation in an example of the present invention.

Tables 4 and 5, and FIG. 9, illustrate the results of an assessment, in accordance with a method including the above-described simulation, of the way in which the color rendering properties of mixed light changes for combinations

TABLE 3

| | Phosphor | | Correlated color temperature [K] | Chromaticity point (x, y) | Ra | Conversion efficiency [lm/W] | Viscosity |
|---|---|---|---|---|---|---|---|
| | Yellow | red | | | | | |
| Example 1 | YAG | KSNAF, SCASN | 2664 | (0.460, 0.407) | 82 | 252 | A |
| Comparative Example 1 | YAG | KSNAF | 2645 | (0.464, 0.411) | 90 | 256 | C |
| Comparative Example 2 | YAG | SCASN | 2698 | (0.460, 0.411) | 71 | 254 | A |
| Example 2 | LSN | KSF, SCASN | 2637 | (0.462, 0.408) | 93 | 220 | A |
| Comparative Example 3 | LSN | KSF | 2686 | (0.460, 0.409) | 87 | 222 | C |
| Comparative Example 4 | LSN | SCASN | 2716 | (0.460, 0.413) | 77 | 228 | A |

A: the resin composition could be scooped with a spatula and dripped quickly into the package. Dripping of the target amount of the resin composition was complete over a short time (within 5 seconds). Dispensing using a dispenser was possible at ordinary pressure. No spraying out of a nozzle occurred even when the pressure was raised.
C: a long time (10 seconds or longer) has to elapse until complete dripping of the target amount of resin composition upon scooping of the resin composition with a spatula and transfer to the package. Dispensing using a dispenser was not possible at an ordinary pressure. Spraying out of a nozzle occurred when the pressure was raised.

The conversion efficiency given in Table 3 is a value resulting from dividing the luminous flux of the white LEDs (upon application of 20 mA) by the bare chip output (upon application of 20 mA) of the blue LED element that is mounted in the 3528SMD-type PPA resin package, as measured before sealing with a silicone resin composition. As Table 3 shows, the conversion efficiency of the white LEDs according to Examples 1 to 2 and Comparative Examples 1 to 4 are substantially identical. However, the color rendering properties of the white LEDs, an indicator of which is the average color rendering index Ra, are best in Comparative Examples 1 and 3, next in Examples 1 and 2, and poorest in Comparative Examples 2 and 4. The average color rendering index Ra in the white LEDs of Examples 1 and 2 is 82. Therefore, the white LEDs satisfy the required illumination levels in, for instance, homes, hotels, restaurants, shops, offices, schools, hospitals and factories where precision work is performed. By contrast, the color rendering properties in the white LEDs of Comparative Examples 2 and 4, where no KSNAF or KSF is used in the red phosphor, fail to reach these levels.

A simulation was performed next on changes in color rendering properties upon changes in the content ratio of $Eu^{2+}$-activated alkaline earth silicon nitride phosphor with respect to the total of $Mn^{4+}$-activated fluoride complex phosphor and $Eu^{2+}$-activated alkaline earth silicon nitride phosphor. The simulation was carried out as follows, using an emission spectrum measured upon application of a 20 mA current to various white LED samples. A synthetic spectrum was created by selecting one type of each white light-emitting device corresponding to the white LED that uses 100% of KSF, as a red phosphor, plus LSN, of Comparative Example 3, and the white LED that uses 100% of SCASN, as a red phosphor, plus LSN, of Comparative Example 4, and by adding the respective emission spectra, at a ratio of n:(10−n). The CIE chromaticity coordinate value (x,y), the correlated color temperature Tcp and the average color rendering index Ra for the created synthetic spectrum were worked out by calculation. Changes in the luminous flux ratio of the two in which there varies the proportion of emission spectra for the white LED of LSN+KSF 100% as the red phosphor (Comparative Example 5 when n=0) and the white LED of LSN+SCASN 100% (Comparative Example 9 when n=10).

TABLE 4

| | Phosphor type | | Phosphor blending ratio [wt %] | Content ratio % of SCASN with respect to total KSF + SCASN [wt %/wt %] |
|---|---|---|---|---|
| | Emission color | Abbreviation | | |
| Comparative Example 5 | Yellow | LSN | 4.4 | 0.0 |
| | Red | KSF | 31.7 | |
| | Red | SCASN | 0.0 | |
| Example 3 | Yellow | LSN | 4.8 | 0.8 |
| | Red | KSF | 28.5 | |
| | Red | SCASN | 0.2 | |
| Example 4 | Yellow | LSN | 5.1 | 1.9 |
| | Red | KSF | 25.4 | |
| | Red | SCASN | 0.5 | |
| Example 5 | Yellow | LSN | 5.5 | 3.1 |
| | Red | KSF | 22.2 | |
| | Red | SCASN | 0.7 | |
| Example 6 | Yellow | LSN | 5.9 | 4.8 |
| | Red | KSF | 19.0 | |
| | Red | SCASN | 1.0 | |
| Example 7 | Yellow | LSN | 6.3 | 7.0 |
| | Red | KSF | 15.9 | |
| | Red | SCASN | 1.2 | |
| Example 8 | Yellow | LSN | 6.6 | 10.2 |
| | Red | KSF | 12.7 | |
| | Red | SCASN | 1.4 | |
| Comparative Example 6 | Yellow | LSN | 7.0 | 15.0 |
| | Red | KSF | 9.5 | |
| | Red | SCASN | 1.7 | |
| Comparative Example 7 | Yellow | LSN | 7.4 | 23.2 |
| | Red | KSF | 6.3 | |
| | Red | SCASN | 1.9 | |
| Comparative Example 8 | Red | LSN | 7.7 | 40.5 |
| | Red | KSF | 3.2 | |
| | Red | SCASN | 2.2 | |

TABLE 4-continued

| | Phosphor type | | Phosphor blending ratio [wt %] | Content ratio % of SCASN with respect to total KSF + SCASN [wt %/wt %] |
|---|---|---|---|---|
| | Emission color | Abbreviation | | |
| Comparative Example 9 | Red | LSN | 8.1 | 100.0 |
| | Red | KSF | 0.0 | |
| | Red | SCASN | 2.4 | |

TABLE 5

| | Phosphor | | Correlated color temperature [K] | Chromaticity point (x, y) | Ra | Blending ratio of red phosphor (KSF:SCASN) |
|---|---|---|---|---|---|---|
| | Yellow | Red | | | | |
| Comparative Example 5 | LSN | KSF | 2629 | (0.461, 0.403) | 86 | 100:0 |
| Example 3 | LSN | KSF, SCASN | 2640 | (0.461, 0.404) | 89 | 90:10 |
| Example 4 | LSN | KSF, SCASN | 2650 | (0.460, 0.405) | 91 | 80:20 |
| Example 5 | LSN | KSF, SCASN | 2660 | (0.460, 0.406) | 93 | 70:30 |
| Example 6 | LSN | KSF, SCASN | 2670 | (0.460, 0.407) | 93 | 60:40 |
| Example 7 | LSN | KSF, SCASN | 2681 | (0.460, 0.408) | 91 | 50:50 |
| Example 8 | LSN | KSF, SCASN | 2691 | (0.460, 0.409) | 88 | 40:60 |
| Comparative Example 6 | LSN | KSF, SCASN | 2701 | (0.460, 0.410) | 86 | 30:70 |
| Comparative Example 7 | LSN | KSF, SCASN | 2710 | (0.459, 0.411) | 83 | 20:80 |
| Comparative Example 8 | LSN | KSF SCASN | 2720 | (0.459, 0.412) | 80 | 10:90 |
| Comparative Example 9 | LSN | SCASN | 2730 | (0.459, 0.413) | 77 | 0:100 |

INDUSTRIAL APPLICABILITY

The white light-emitting device of the invention of the present application can be used in an illumination device such as light bulbs, downlights, line illumination and the like.

While the invention has been described in detail and with reference to specific embodiments thereof, it will be apparent to one skilled in the art that various changes and modifications can be made therein without departing from the spirit and scope thereof.

EXPLANATION OF REFERENCE NUMERALS 10, 20, 30 white light-emitting device
11, 21, 31 package
12, 22, 32 blue LED element
13 wavelength conversion layer
23a, 33a first wavelength conversion layer
23b, 33b second wavelength conversion layer
33c third wavelength conversion layer

The invention claimed is:

1. A white light-emitting device comprising: an LED element that emits blue light; and a resin composition that contains a phosphor that emits yellow light and/or a phosphor that emits green light through wavelength conversion of light emitted by the LED element that emits blue light, and a phosphor that emits red light through wavelength conversion of light emitted by the LED element that emits blue light, wherein the phosphor that emits red light contains at least a $Mn^{4+}$-activated fluoride complex phosphor and an $Eu^{2+}$-activated alkaline earth silicon nitride phosphor, and a content ratio of the $Eu^{2+}$-activated alkaline earth silicon nitride phosphor with respect to the total of the $Mn^{4+}$-activated fluoride complex phosphor and $Eu^{2+}$-activated alkaline earth silicon nitride phosphor contained in the resin composition ranges from 0.5 wt % to 14.0 wt %.

2. A white light-emitting device comprising: an LED element; and a resin composition that contains a phosphor that emits blue light through wavelength conversion of light emitted by the LED element, a phosphor that emits yellow light and/or a phosphor that emits green light through wavelength conversion of light emitted by the LED element, and a phosphor that emits red light through wavelength conversion of light emitted by the LED element, wherein the phosphor that emits red light contains at least a $Mn^{4+}$-activated fluoride complex phosphor and an $Eu^{2+}$-activated alkaline earth silicon nitride phosphor, and a content ratio of the $Eu^{2+}$-activated alkaline earth silicon nitride phosphor with respect to the total of the $Mn^{4+}$-activated fluoride complex phosphor and $Eu^{2+}$-activated alkaline earth silicon nitride phosphor contained in the resin composition ranges from 0.5 wt % to 14.0 wt %.

3. The white light-emitting device according to claim 1 or 2, wherein $\lambda_{R1}-20 \leq \lambda_{R2} \leq \lambda_{R1}+30$ is satisfied where $\lambda_{R1}$ nm is an emission peak wavelength of the $Mn^{4+}$-activated fluoride complex phosphor and $\lambda_{R2}$ nm is an emission peak wavelength of the $Eu^{2+}$-activated alkaline earth silicon nitride phosphor.

4. The white light-emitting device according to claim 1 or 2, wherein a maximum peak wavelength in an emission spectrum of the $Eu^{2+}$-activated alkaline earth silicon nitride phosphor ranges from 600 to 630 nm.

5. The white light-emitting device according to claim 3, wherein the $Mn^{4+}$-activated fluoride complex phosphor is KSF or KSNAF.

6. The white light-emitting device according to claim 3, wherein the $Eu^{2+}$-activated alkaline earth silicon nitride phosphor is $Sr_yCa_{1-y}AlSiN_3$:Eu.

7. The white light-emitting device according to claim 1 or 2, wherein the phosphor that emits yellow light is a $(Y_{1-u},Gd_u)_3(Al_{1-v}Ga_v)_5O_{12}$:Ce,Eu phosphor (where u and v are 0≤u≤0.3 and 0≤v≤0.5, respectively) or $Ca_{1.5x}La_{3-x}Si_6N_{11}$:Ce (where x is 0≤x≤1).

8. The white light-emitting device according to claim 1 or 2, wherein the $Mn^{4+}$-activated fluoride complex phosphor is dispersed in a cured product of a resin paste.

9. The white light-emitting device according to claim 8, wherein a base resin of the resin paste is a silicone resin.

10. The white light-emitting device according to claim 1 or 2, wherein a correlated color temperature of emitted white light ranges from 1600 to 4000K.

11. The white light-emitting device according to claim 1 or 2, wherein a correlated color temperature of emitted white light ranges from 2500 to 3500K.

12. The white light-emitting device according to claim 1 or 2, wherein a blending proportion of the $Mn^{4+}$-activated fluoride complex phosphor contained in the resin composition ranges from 10 wt % to 50 wt %, and
a blending proportion of the $Eu^{2+}$-activated alkaline earth silicon nitride phosphor contained in the resin composition ranges from 0.1 wt % to 5.0 wt %.

13. A white light-emitting device, comprising: an LED element that emits blue light; a phosphor that emits yellow light and/or a phosphor that emits green light through wavelength conversion of light emitted by the LED element that emits blue light; and a phosphor that emits red light through wavelength conversion of light emitted by the LED element that emits blue light; or comprising: an LED element; a phosphor that emits blue light through wavelength conversion of light emitted by the LED element; a phosphor that emits yellow light and/or a phosphor that emits green light through wavelength conversion of light emitted by the LED element; and a phosphor that emits red light through wavelength conversion of light emitted by the LED element,
wherein the phosphor that emits red light contains a $Mn^{4+}$-activated fluoride complex phosphor dispersed in a first translucent matrix and an $Eu^{2+}$-activated alkaline earth silicon nitride phosphor dispersed in a second translucent matrix, and
a content ratio of the $Eu^{2+}$-activated alkaline earth silicon nitride phosphor with respect to the total of the $Mn^{4+}$-activated fluoride complex phosphor and $Eu^{2+}$-activated alkaline earth silicon nitride phosphor ranges from 0.5 wt % to 14.0 wt %.

14. The white light-emitting device according to claim 13, wherein a refractive index of the first translucent matrix is lower than a refractive index of the second translucent matrix.

15. The white light-emitting device according to claim 14, wherein all the phosphors, except the $Mn^{4+}$-activated fluoride complex phosphor, are dispersed in the second translucent matrix.

16. The white light-emitting device according to claim 13, wherein the first translucent matrix is a cured product of a resin paste.

17. The white light-emitting device according to claim 16, wherein a base resin of the resin paste is a silicone resin.

18. The white light-emitting device according to claim 17, wherein a refractive index of the silicone resin is smaller than 1.45.

19. The white light-emitting device according to claim 13, wherein a correlated color temperature of emitted white light ranges from 1600 to 4000K.

20. The white light-emitting device according to claim 13, wherein a correlated color temperature of emitted white light ranges from 2500 to 3500K.

21. The white light-emitting device according to claim 13, wherein the LED element, the first translucent matrix and the second translucent matrix are placed to make a interspace between the LED element, and the first translucent matrix and the second translucent matrix.

22. A white light-emitting device comprising: an LED element that emits blue light; and a resin composition that contains a phosphor that emits yellow light and/or a phosphor that emits green light through wavelength conversion of light emitted by the LED element that emits blue light, and a phosphor that emits red light through wavelength conversion of light emitted by the LED element that emits blue light,
wherein the phosphor that emits red light contains at least a red phosphor having a narrow-band emission spectrum such that a maximum emission peak thereof ranges from 600 nm to 660 nm and the full width at half maximum of a red emission peak is 20 nm or less, and a red phosphor having a broad-band emission spectrum such that a maximum emission peak thereof ranges from 600 nm to 660 nm and the full width at half maximum of a red emission peak is 80 nm or more, and
a content ratio of the red phosphor having the broad-band emission spectrum with respect to the total of the red phosphor having the narrow-band emission spectrum and the red phosphor having the broad-band emission spectrum that are contained in the resin composition ranges from 0.5 wt % to 14.0 wt %.

23. A white light-emitting device comprising: an LED element; and a resin composition that contains a phosphor that emits blue light through wavelength conversion of light emitted by the LED element, a phosphor that emits yellow light and/or a phosphor that emits green light through wavelength conversion of light emitted by the LED element, and a phosphor that emits red light through wavelength conversion of light emitted by the LED element,
wherein the phosphor that emits red light contains at least a red phosphor having a narrow-band emission spectrum such that a maximum emission peak thereof ranges from 600 nm to 660 nm and the full width at half maximum of a red emission peak is 20 nm or less, and a red phosphor having a broad-band emission spectrum such that a maximum emission peak thereof ranges from 600 nm to 660 nm and the full width at half maximum of a red emission peak is 80 nm or more, and
a content ratio of the red phosphor having the broad-band emission spectrum with respect to the total of the red phosphor having the narrow-band emission spectrum and the red phosphor having the broad-band emission spectrum that are contained in the resin composition ranges from 0.5 wt % to 14.0 wt %.

24. The white light-emitting device according to claim 22 or 23, wherein a blending proportion of the red phosphor having the narrow-band emission spectrum and contained in the resin composition ranges from 10 wt % to 50 wt %.

25. The white light-emitting device according to claim 22 or 23, wherein a blending proportion of the red phosphor having the broad-band emission spectrum and contained in the resin composition ranges from 0.1 wt % to 5.0 wt %.

26. The white light-emitting device according to any one of claim 1, 2, 22, or 23, wherein the LED element and the resin composition are placed to make a interspace between the LED element and the resin composition.

27. A white light-emitting device comprising: an LED element that emits blue light; and a translucent matrix that contains a phosphor that emits yellow light and/or a phosphor that emits green light through wavelength conversion of light emitted by the LED element that emits blue light, and a phosphor that emits red light through wavelength conversion of light emitted by the LED element that emits blue light; or comprising: an LED element; and a translucent matrix that contains a phosphor that emits blue light through wavelength conversion of light emitted by the LED element, a phosphor that emits yellow light and/or a phosphor that emits green light through wavelength conversion of light emitted by the LED element, and a phosphor that emits red light through wavelength conversion of light emitted by the LED element, wherein the phosphor that emits red light contains at least a red phosphor having a narrow-band emission spectrum such that a maximum emission peak thereof ranges from 600 nm to 660 nm and the full width at half maximum of a red emission peak is 20 nm or less, and a red phosphor having a broad-band emission spectrum such that a maximum emission peak thereof ranges from 600 nm to 660 nm and the full width at half maximum of a red emission peak is 80 nm or more, and a content ratio of the red phosphor having the broad-band emission spectrum with respect to the total of the red phosphor having the narrow-band emission spectrum and the red phosphor having the broad-band emission spectrum that are contained in the translucent matrix ranges from 0.5 wt % to 14.0 wt %.

28. An illumination device, comprising the white light-emitting device according to any one of claim 1, 2, 22, 23 or 27.

* * * * *